US010311666B2

(12) United States Patent
Sato et al.

(10) Patent No.: US 10,311,666 B2
(45) Date of Patent: Jun. 4, 2019

(54) CONTROL DEVICE, CONTROL SYSTEM, CONTROL METHOD AND PROGRAM

(71) Applicant: Mitsubishi Electric Corporation, Tokyo (JP)

(72) Inventors: Kaori Sato, Tokyo (JP); Ichiro Maruyama, Tokyo (JP); Satoshi Minezawa, Tokyo (JP); Hirotoshi Yano, Tokyo (JP); Masaaki Yabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/548,809

(22) PCT Filed: Feb. 9, 2015

(86) PCT No.: PCT/JP2015/053515
§ 371 (c)(1),
(2) Date: Aug. 4, 2017

(87) PCT Pub. No.: WO2016/129034
PCT Pub. Date: Aug. 18, 2016

(65) Prior Publication Data
US 2018/0018850 A1    Jan. 18, 2018

(51) Int. Cl.
*H02J 3/00* (2006.01)
*H02J 3/14* (2006.01)
(Continued)

(52) U.S. Cl.
CPC ..... *G07F 15/006* (2013.01); *G01R 19/16547* (2013.01); *G05B 13/026* (2013.01);
(Continued)

(58) Field of Classification Search
None
See application file for complete search history.

(56) References Cited

U.S. PATENT DOCUMENTS 7,062,361 B1 * 6/2006 Lane ............... F25D 29/00
                                                    700/291
2004/0002792 A1 * 1/2004 Hoffknecht ......... G05B 15/02
                                                    700/295
(Continued)

FOREIGN PATENT DOCUMENTS

JP    2011-092002 A    5/2011
JP    2011-142753 A    7/2011
(Continued)

OTHER PUBLICATIONS

Office Action dated Dec. 12, 2017 issued in corresponding JP patent application No. 2016-574537 (and English translation).
(Continued)

*Primary Examiner* — Ryan A Jarrett
(74) *Attorney, Agent, or Firm* — Posz Law Group, PLC

(57) ABSTRACT

A prediction value calculator calculates a prediction value of an electricity fee based on the amount of electric power supplied from a commercial electric power source to electric equipment within an electricity fee calculation period. A selector selects, as a first-stage control, either one control of an electric power saving control for the electric equipment and a charge-discharge control in which the electric power supplied from the commercial electric power source is stored in a storage battery in a first time slot and the electric power stored in the storage battery is supplied to the electric equipment in a second time slot in which the unit cost of the electric power supplied from the commercial electric power source is greater than that in the first time slot. A controller executes the first-stage control selected by the selector when the prediction value calculated by the prediction value calculator is greater than a targeted value of the electricity fee.

9 Claims, 12 Drawing Sheets

(51) Int. Cl.
- *H02J 3/32* (2006.01)
- *H02J 7/00* (2006.01)
- *G05B 13/02* (2006.01)
- *G07F 15/00* (2006.01)
- *H02J 13/00* (2006.01)
- *G01R 19/165* (2006.01)

(52) U.S. Cl.
CPC ............... *H02J 3/008* (2013.01); *H02J 3/14* (2013.01); *H02J 3/32* (2013.01); *H02J 7/0068* (2013.01); *H02J 13/0096* (2013.01); *Y02B 70/3225* (2013.01); *Y02B 70/3266* (2013.01); *Y04S 20/222* (2013.01); *Y04S 20/224* (2013.01); *Y04S 20/242* (2013.01); *Y04S 50/10* (2013.01)

(56) References Cited

U.S. PATENT DOCUMENTS

| | | | |
|---|---|---|---|
| 2007/0239372 A1* | 10/2007 | Schweitzer | H02J 3/14 702/57 |
| 2011/0178959 A1 | 7/2011 | Nakajima et al. | |
| 2011/0196547 A1 | 8/2011 | Park et al. | |
| 2014/0005852 A1 | 1/2014 | Asghari et al. | |
| 2014/0201110 A1 | 7/2014 | Sato | |

FOREIGN PATENT DOCUMENTS

| | | |
|---|---|---|
| JP | 2011-151896 A | 8/2011 |
| JP | 2012-120295 A | 6/2012 |
| JP | 2014-078127 A | 5/2014 |
| JP | 2014-137726 A | 7/2014 |
| JP | 2014-238878 A | 12/2014 |
| JP | 2015-006058 A | 1/2015 |

OTHER PUBLICATIONS

Masatsune Terauchi et al., "Development and Demonstration of Home Energy Device and Appliances Control Technology Based on Prediction of Power Consumption", Sharp Technical Report, Japan, Sharp Kabushiki Kaisha, Jul. 31, 2014, No. 107, pp. 13-18 (and English abstract).

Kei Furukawa, "Multi-building energy management system on campus", Smart grid, Japan, Okawa Publication, Jul. 15, 2013, 3rd Volume, No. 3, pp. 33-38.

International Search Report of the International Searching Authority dated Apr. 28, 2015 for the corresponding International application No. PCT/JP2015/053515 (and English translation).

Extended European Search Report dated Jul. 9, 2018 issued in corresponding EP patent application No. 15881909.4.

Office Action dated Mar. 13, 2019 dated in corresponding European patent application No. 15 881 909.4.

\* cited by examiner

CONTROL DEVICE, CONTROL SYSTEM, CONTROL METHOD AND PROGRAM

CROSS REFERENCE TO RELATED APPLICATION

This application is a U.S. national stage application of International Patent Application No. PCT/JP2015/053515 filed on Feb. 9, 2015, the disclosure of which is incorporated herein by reference.

TECHNICAL FIELD

The present disclosure relates to a control device, a control system, a control method, and a program to execute a charge-discharge control or an electric power saving control.

BACKGROUND ART

There are cases when a power consumer receiving electric power supplied from an electric power company considers reducing an electricity fee to lower than or equal to a target value. In such cases, the power consumer checks whether the electricity fee is going to exceed the target value, for example, during the electricity fee calculation period (for example, one month). The power consumer takes measures to reduce an amount of consumed electric power, for example, after the power consumer determines that the electricity fee is going to exceed the target value.

Currently, various techniques are known for supporting such measures. For example, Patent Literature 1 discloses a terminal device displaying on a screen a calculation value of an electricity fee from a first day to a current day of a month and a prediction value of the electricity fee in the month.

CITATION LIST

Patent Literature

Patent Literature 1: Unexamined Japanese Patent Application Kokai Publication No. 2014-137726.

SUMMARY OF INVENTION

Technical Problem

However, the technique disclosed in the Patent Literature 1 is merely a technique for supporting a user in suppressing an electricity fee lower than or equal to a target value and is a technique in which whether the electricity fee can be reduced to lower than or equal to the target value depends on the user. In other words, a technique disclosed in Patent Literature 1 is not a technique that executes a control for reducing the electricity fee to lower than or equal to the target value. Therefore, a technique appropriately reducing the electricity fee is desired.

An objective of the disclosure is to provide a control device, a control system, a control method, and a program that appropriately reduce the electricity fee.

Solution to Problem

In order to achieve the above objective, the control device according to the present disclosure includes:

a prediction value calculator configured to calculate a prediction value of an electricity fee based on an amount of electric power supplied from a commercial electric power source to electric equipment within an electricity fee calculation period;

a selector configured to select, as a first-stage control, either one control of an electric power saving control for the electric equipment and a charge-discharge control in which the electric power supplied from the commercial electric power source is stored in a storage battery in a first time slot and the electric power stored in the storage battery is supplied to the electric equipment in a second time slot in which a unit cost of the electric power supplied from the commercial electric power source is greater than that in the first time slot; and a controller configured to execute the first-stage control selected by the selector, when the prediction value calculated by the prediction value calculator is greater than a target value of an electricity fee.

Advantageous Effects of Invention

According to the present disclosure, when a prediction value of an electricity fee is greater than a target electricity fee value, at least one of a charge-discharge control or an electric power saving control is executed. Therefore, according to the present disclosure, an electricity fee can appropriately be reduced.

DESCRIPTION OF EMBODIMENTS

Embodiment 1

Figure 1:
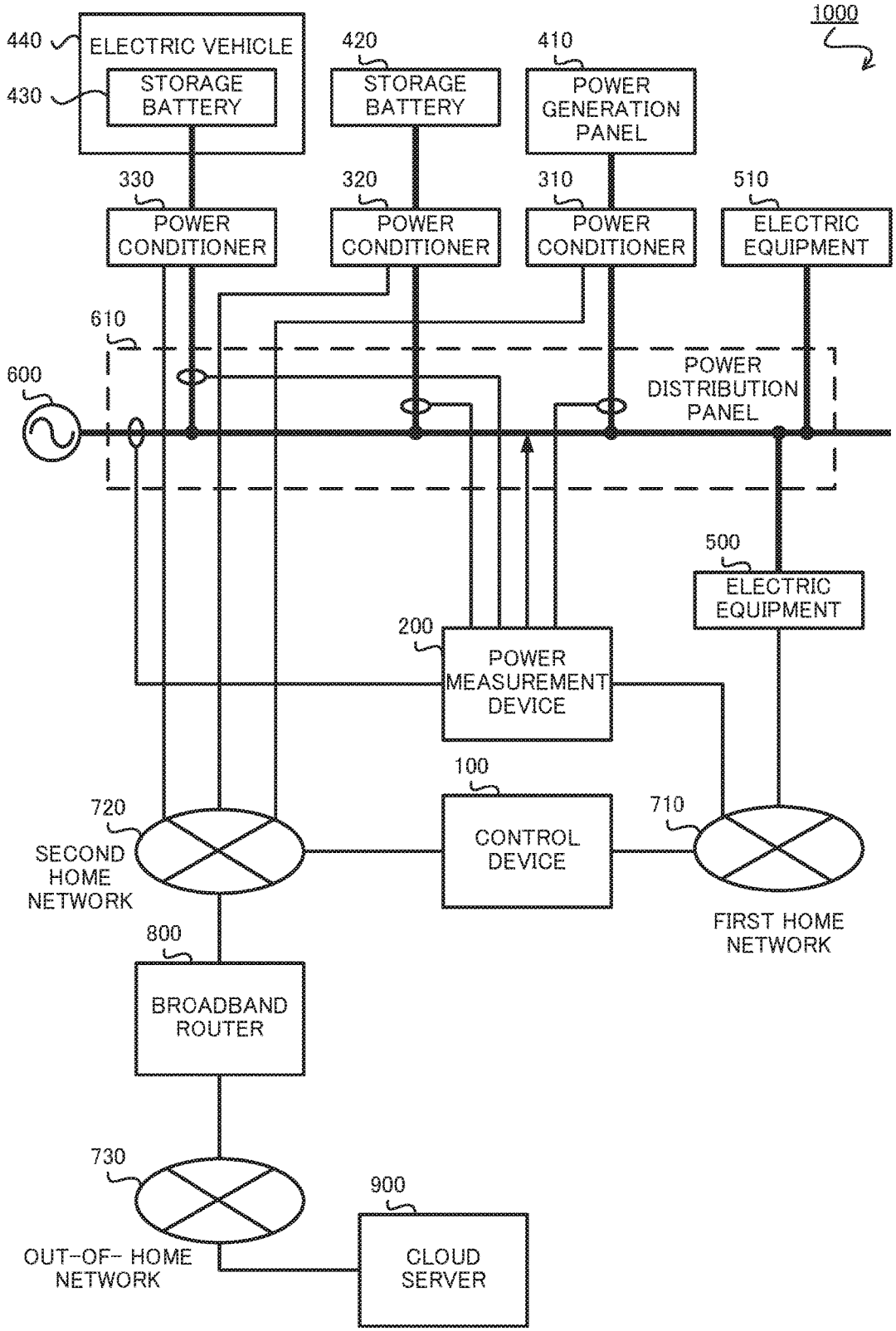
FIG. 1 is a configuration diagram of a control system according to Embodiment 1 of the present disclosure.

First, the configuration of a control system 1000 according to Embodiment 1 of the present disclosure is described with reference to FIG. 1. The control system 1000 is, for example, a Home Energy Management System (HEMS) that effectively manages electric power consumed at home. The control system 1000 is basically a system in which a control device 100 controls electric equipment 500. The control device 100 executes a control for reducing an electricity fee so that an electricity fee in an electricity fee calculation period (for example, one month) does not exceed a target value.

Specifically, the control device 100 executes a first-stage control when the control device 100 detects that the prediction value of the electricity fee is greater than a target electricity fee value during the calculation period. Furthermore, in addition to the first-stage control, the control device 100 executes a second-stage control in a case where the prediction value is greater than the target value and a difference between the prediction value and the target value is greater than a first threshold. The first-stage control is a charge-discharge control or an electric power saving control. The second-stage control is the charge-discharge control or the electric power saving control, and is a control except the first-stage control. As will be described later, one of the charge-discharge control and the electric power saving control is selected as the first-stage control depending on a user's request and/or the electric power-consumption situation.

The charge-discharge control is a control using a storage battery 420, charges the storage battery 420 using electric power supplied from a commercial electric power source 600, and discharges the electric power stored in the storage battery 420 and supplies the stored electric power to the electric equipment 500. The electric power saving control is a control for the electric equipment 500, and is for reducing consuming electric power of the electric equipment 500. When the control device 100 executes the electric power saving control, the control device 100 transmits to the electric equipment 500 a control command instructing an execution of a process that consumes relatively low electric power, and/or sets an energy saving mode in which the process that consumes relatively low electric power is executed.

When the charge-discharge control is executed, electric power supplied from the commercial electric power source 600 in a first time slot (for example, nighttime (22:00 through 06:00 the next morning)) is stored in the storage battery 420, and the electric power stored in the storage battery 420 is supplied to the electric equipment 500 in the second time slot (for example, day time (from 06:00 to 22:00)) in which the unit cost of the electric power is greater than that in the first time slot. Therefore, the electricity fee may be largely reduced when the charge-discharge control is executed.

However, even if the charge-discharge control is executed, the electricity fee may not be reduced because of an electric power loss due to the Alternating Current (AC)/Direct Current (DC) conversion at the time of charging, an electric power loss due to the DC/AC conversion at the time of discharging, an electric power loss due to natural electric discharge at the time of the electric power storage, and the like. In addition, when the charge-discharge control is executed, a life of the storage battery 420 may be shortened, and/or a control for the electric equipment 500 may become complicated.

In addition, a reduction of consumed electric power of the electric equipment 500 can be expected when the electric power saving control is executed. Therefore, the electricity fee may be largely reduced when the electric power saving control is executed. However, when the electric power saving control is executed, an optimal operation by the electric equipment 500 may be limited, and convenience may be decreased. Thus, in the present embodiment, while the prediction value of the electricity fee is less than the target electricity fee value, the first-stage control and the second-stage control (the charge-discharge control and the electric power saving control) are not executed, and when the prediction value of the electricity fee that is greater than the target electricity fee value is detected, the first-stage control and the second-stage control are executed.

A control using electric power generated by an electric power generation panel 410 is considered as the charge-discharge control using the storage battery 420. However, in the present embodiment, for easier understanding, it is assumed that the electric power generated by the electric power generation panel 410 is consumed by the electric equipment 500, or supplied to the commercial electric power source 600 (sold to an electric power company) and is not supplied to the storage battery 420. In addition, in the present embodiment, for easier understanding, the charge-discharge control using a storage battery 430 is assumed not to be executed. Furthermore, in the present embodiment, for easier understanding, the electric equipment 510 is assumed to consume electric power, but is assumed not to be controlled by the control device 100.

The control system 1000 comprises the control device 100, an electric power measurement device 200, an electric power conditioner 310, an electric power conditioner 320, an electric power conditioner 330, the electric power generation panel 410, the storage battery 420, an electric vehicle 440 provided with the storage battery 430, the electric equipment 500, the electric equipment 510, the commercial electric power source 600, an electric power distribution panel 610, a first home network 710, a second home network 720, an out-of-home network 730, a broadband router 800, and a cloud server 900.

Figure 2:
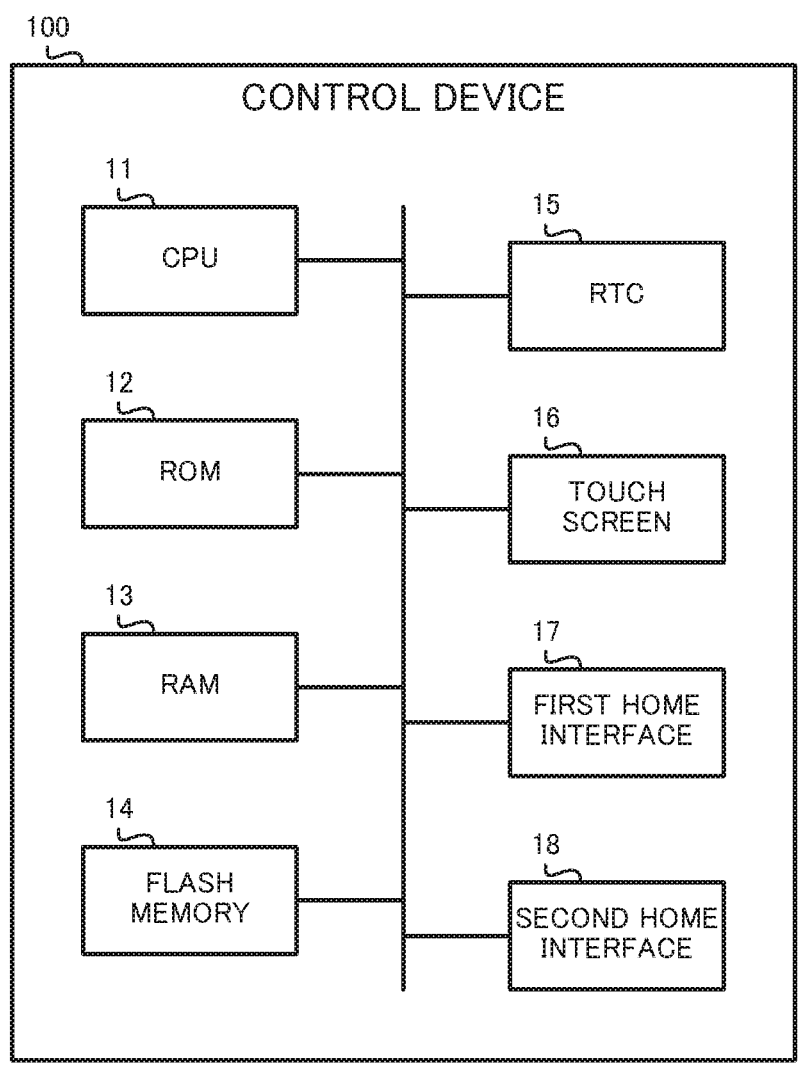
FIG. 2 is a configuration diagram of the control device according to Embodiment 1 of the present disclosure.

The control device 100 manages the electric power consumed by the electric equipment 500 and also controls and monitors the electric equipment 500. The control device 100 communicates with the electric power measurement device 200 and the electric equipment 500 via the first home network 710. The control device 100 communicates with the electric power conditioner 310, the electric power conditioner 320, the electric power conditioner 330, the cloud server 900, and the like via the second home network 720. With reference to FIG. 2, a configuration of the control device 100 is described as follows.

As illustrated in FIG. 2, the control device 100 includes a Central Processing Unit (CPU) 11, a Read Only Memory (ROM) 12, a Random Access Memory (RAM) 13, a flash memory 14, a Real Time Clock (RTC) 15, a touch screen 16, a first home interface 17, and a second home interface 18. Each component included in the control device 100 is mutually connected via a bus.

The CPU 11 controls overall operation of the control device 100. In addition, the CPU 11 is operated according to a program stored in the ROM 12 and uses the RAM 13 as a working area. In the ROM 12, a program and data to control the overall operation of the control device 100 are stored. The RAM 13 functions as the working area of the CPU 11. In other words, the CPU 11 temporarily writes the program and the data in the RAM 13 and refers to a program and data as appropriate.

The flash memory 14 is a nonvolatile memory storing various pieces of information. The electric power information mentioned further below is stored in the flash memory 14. The RTC 15 is a time-keeping device. The RTC 15 has, for example, a built-in battery and continues time-keeping even while an electric power source of the control device 100 off. The RTC 15 includes, for example, an oscillation circuit provided with a crystal oscillator.

The touch screen 16 detects a touch operation performed by a user and supplies to the CPU 11 a signal indicating the result of the detection. In addition, the touch screen 16 displays an image based on an image signal supplied from the CPU 11 and/or the like. In this way, the touch screen 16 functions as a user interface of the control device 100.

The first home interface 17 is an interface for connecting the control device 100 to the first home network 710. The control device 100 communicates with a device connected to the first home network 710 via the first home network 710. The first home interface 17 includes a wireless Local Area Network (LAN) interface to be connected to a subnetwork such as ECHONET Lite and the like.

The second home interface 18 is an interface for connecting the control device 100 to the second home network 720. The control device 100 communicates with a device connected to the second home network 720 via the second home network 720. The second home interface 18 includes a LAN interface such as the Network Interface Card (NIC) and the like.

The electric power measurement device 200 measures a value of an electric current flowing through an electric power line and a value of a voltage between electric power lines and also measures a value of an electric power supplied via the electric power lines. In addition, the electric power measurement device 200 calculates an amount of electric power in a unit period (for example, one minute), an accumulated amount of electric power from a reference time and the like based on the value of the measured electric power. The electric power measurement device 200 stores information indicating physical quantity acquired by a measurement or a calculation as electric power information. The electric power measurement device 200 appropriately transmits the stored electric power information to the control device 100. In the present embodiment, the electric power information is assumed to indicate at least the amount of electric power (hereinafter, referred to as "purchased amount of electric power" appropriately) supplied to the electric power distribution panel 610 from the commercial electric power source 600 each unit period.

In addition, in the present embodiment, for easier understanding, "supplying electric power from a device of the electric power supply source to a device of an electric power supply destination via the electric power distribution panel 610" is referred to as "the electric power is supplied from the device of the electric power supply source to the electric power distribution panel 610 and electric power is supplied from the electric power distribution panel 610 to the device of the electric power supply destination". In addition, in the present embodiment, the electric power consumed by the control device 100, the electric power measurement device 200, the broadband router 800, and the like is assumed to be sufficiently less than electric power consumed by the electric equipment 500, the electric equipment 510, and the like. Therefore, the present embodiment does not illustrate a state in which the control device 100, the electric power measurement device 200, and the broadband router 800 receive the electric power supplied from the electric power distribution panel 610.

Figure 3:
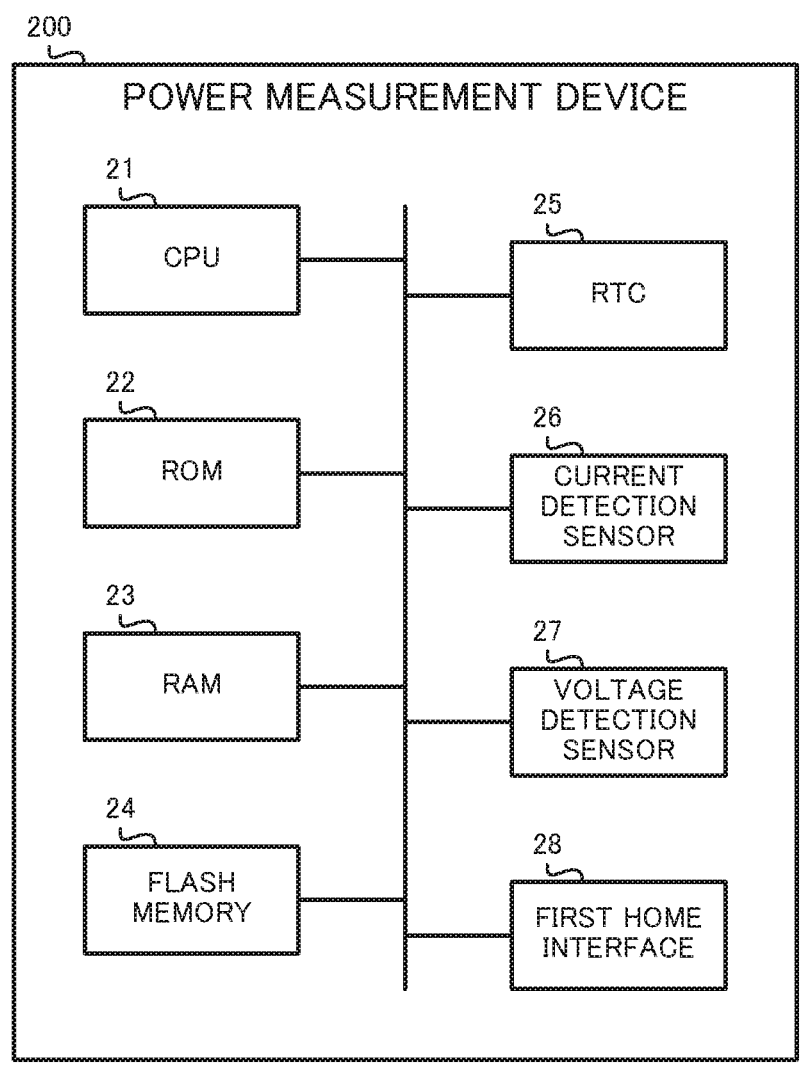
FIG. 3 is a configuration diagram of an electric power measurement device according to Embodiment 1 of the present disclosure.

The electric power measurement device 200 typically measures electric power supplied from the commercial electric power source 600 to the electric power distribution panel 610 (hereinafter, referred to as "purchased electric power" as appropriate), electric power supplied from the electric power generation panel 410 to the electric power distribution panel 610 (hereinafter, referred to as "generated electric power" as appropriate), electric power supplied from the storage battery 420 to the electric power distribution panel 610 (or electric power supplied from the electric power distribution panel 610 to the storage battery 420), electric power supplied from the storage battery 430 to the electric power distribution panel 610 (or electric power supplied from the electric power distribution panel 610 to the storage battery 430), and the like. With reference to FIG. 3, a configuration of the electric power measurement device 200 is explained as follows.

As illustrated in FIG. 3, the electric power measurement device 200 includes a CPU 21, a ROM 22, a RAM 23, a flash memory 24, an RTC 25, a current detection sensor 26, a voltage detection sensor 27, and a first home interface 28. Each component included in the electric power measurement device 200 is mutually connected via a bus.

The CPU 21 controls overall operation of the electric power measurement device 200. In addition, the CPU 21 is operated according to a program stored in the ROM 22 and uses the RAM 23 as a working area. In the ROM 22, a program and data for controlling the overall operation of the electric power measurement device 200 are stored. The RAM 23 functions as the working area of the CPU 21. In other words the CPU 21 temporarily writes the program and the data in the RAM 23 and appropriately refers to the program and the data.

The flash memory 24 is a nonvolatile memory storing various pieces of information. For example, the flash memory 24 stores electric power information indicating the purchased amount of electric power every minute. The RTC 25 is a time keeping device. The RTC 25 has, for example, a built-in battery and continues-time-keeping while the electric power source of the electric power measurement device 200 is off. For example, the RTC 25 includes an oscillation circuit provided with a crystal oscillator.

The current detection sensor 26 detects a value of an electric current supplied from the commercial electric power source 600 to the electric power distribution panel 610. In addition, the current detection sensor 26 detects a value of an electric current supplied from the electric power generation panel 410 to the electric power distribution panel 610. In addition, the current detection sensor 26 detects a value of an electric current supplied from the storage battery 420 to the electric power distribution panel 610 (alternatively a value of an electric current supplied from the electric power distribution panel 610 to the storage battery 420). In addition, the current detection sensor 26 detects a value of an electric current supplied from the storage battery 430 to the electric power distribution panel 610 (alternatively a value of an electric current supplied from the electric power distribution panel 610 to the storage battery 430). The CPU 21 calculates values of the electric power, the amount of electric power, integral power consumption based on the value of the electric current detected by the current detection sensor 26, and the value of the voltage detected by the voltage detection sensor 27.

The voltage detection sensor 27 detects voltages between the electric power lines in the electric power distribution panel 610. For example, when AC power is supplied in a single-phase three-wire from the commercial electric power source 600, an electric power line to which the potential of L1 phase is applied, an electric power line to which the potential of L2 phase is applied, and an electric power line to which the potential of N phase is applied exist. In this case the voltage detection sensor 27 detects a potential difference between the L1 phase potential and the N phase potential, a potential difference between the L2 phase potential and the N phase potential, and a potential difference between the L1 phase potential and the L2 phase potential.

The first home interface 28 is an interface for connecting the electric power measurement device 200 to the first home network 710. The electric power measurement device 200 communicates with a device connected to the first home network 710 via the first home network 710. The first home interface 28 basically has a configuration similar to that of the first home interface 17.

Each of the electric power conditioner 310, the electric power conditioner 320, and the electric power conditioner 330 execute processing such as DC/AC conversion and the like in accordance with the control by the control device 100. The electric power conditioner 310 converts direct current electric power (DC power) supplied from the electric power generation panel 410 into alternating current electric power (AC power) and supplies the converted AC power to the electric power distribution panel 610. The electric power conditioner 320 converts DC power supplied from the storage battery 420 into AC power and supplies the converted AC power to the electric power distribution panel 610. In addition, the electric power conditioner 320 converts AC power supplied from the electric power distribution panel 610 into DC power and supplies the converted DC power to the storage battery 420. The electric power conditioner 330 converts DC power supplied from the storage battery 430 into AC power and supplies the converted AC power to the electric power distribution panel 610. In addition, the electric power conditioner 330 converts AC power supplied from the electric power distribution panel 610 into DC power and supplies the converted DC power to the storage battery 430.

Figure 4:
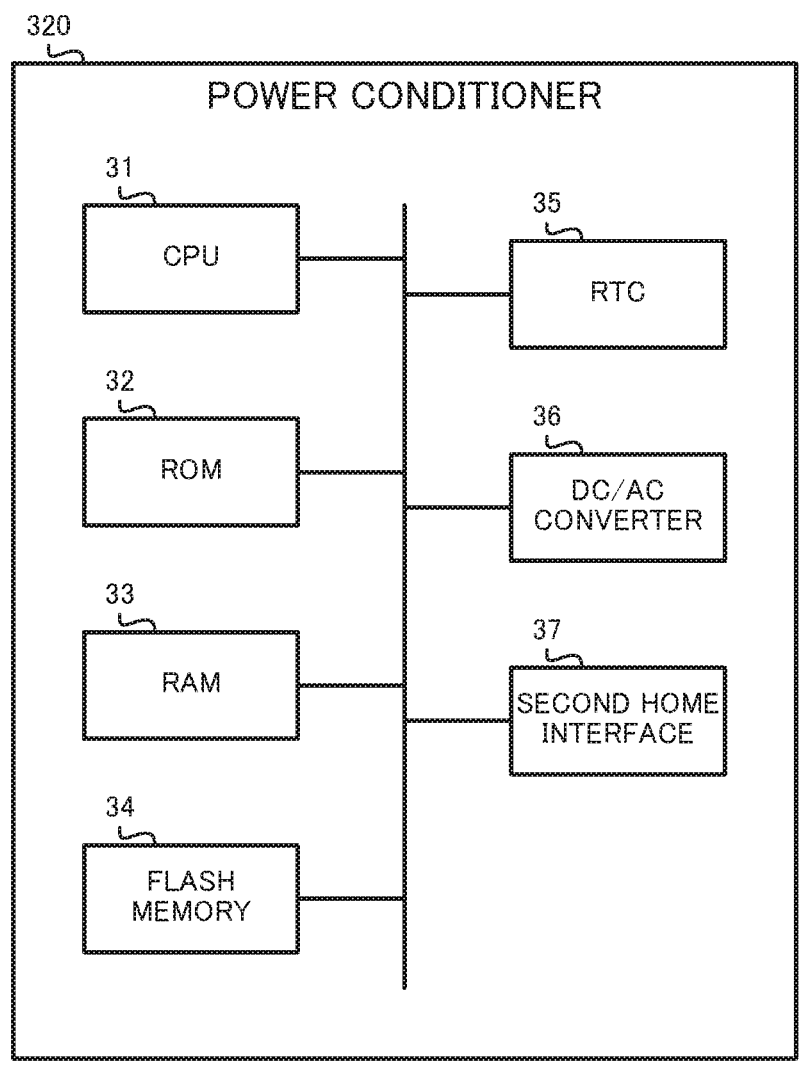
FIG. 4 is a configuration diagram of an electric power conditioner according to Embodiment 1 of the present disclosure.

With reference to FIG. 4, a configuration of the electric power conditioner 320 is explained as follows. In addition, the electric power conditioner 310 and the electric power conditioner 330 basically have configurations similar to that of the electric power conditioner 320.

As illustrated in FIG. 4, the electric power conditioner 320 includes a CPU 31, a ROM 32, a RAM 33, the flash memory 34, an RTC 35, a DC/AC converter 36, and a second home interface 37. Each component included in the electric power conditioner 320 is mutually connected via a bus.

The CPU 31 controls overall operation of the electric power conditioner 320. In addition, the CPU 31 is operated in accordance with a program stored in the ROM 32 and uses the RAM 33 as a working area. In the ROM 32, a program and data for controlling the overall operation of the electric power conditioner 320 are stored. The RAM 33 functions as the working area of the CPU 31. In other words the CPU 31 temporarily writes the program and the data in the RAM 33 and appropriately refers to the program and the data.

The flash memory 34 is a nonvolatile memory storing various pieces of information. The RTC 35 is a time keeping device. The RTC 35 has, for example, a built-in battery and continues time-keeping while an electric power source of the electric power conditioner 320 is off. For example, the RTC 35 includes an oscillation circuit provided with a crystal oscillator.

The DC/AC converter 36 converts DC power supplied from the storage battery 420 into AC power. The DC/AC converter 36 supplies to the electric power distribution panel 610 the AC power provided by the conversion electric power. The DC/AC converter 36 converts AC power supplied from the electric power distribution panel 610 into DC power. The DC/AC converter 36 supplies to the storage battery 420 the DC power provided by the conversion.

The DC/AC converter 36 converts electric power in accordance with the control by the CPU 31. Therefore, when a discharge is instructed by the CPU 31, the DC/AC converter 36 converts DC power supplied from the storage battery 420 into AC power and supplies to the electric power distribution panel 610 the AC power provided by the conversion. In addition, when a charge is instructed by the CPU 31, the DC/AC converter 36 converts AC power supplied from the electric power distribution panel 610 into DC power and supplies to the storage battery 420 the DC power provided by the conversion.

The second home interface 37 is an interface for connecting the electric power conditioner 320 to the second home network 720. The electric power conditioner 320 communicates with a device connected to the second home network 720 via the second home network 720. The second home interface 37 includes a LAN interface such as the NIC.

The electric power generation panel 410 converts solar energy into electrical energy. The electric power generation panel 410 supplies DC power provided by the generation to the electric power conditioner 310.

The storage battery 420 is a stationary storage battery. The storage battery 420 accumulates electric power supplied from the electric power conditioner 320. The storage battery 420 supplies the stored electric power to the electric power conditioner 320.

The storage battery 430 is a storage battery mounted on the electric vehicle 440. The storage battery 430 accumulates electric power supplied from the electric power conditioner 330. The storage battery 430 supplies the stored electric power to the electric power conditioner 330. The electric power stored by the storage battery 430 is used as power source of the electric vehicle 440. In addition, the electric power stored by the storage battery 430 is supplied to the electric equipment 500 and the like via the electric power conditioner 330 and the electric power distribution panel 610, and is consumed by the electric equipment 500 and the like.

The electric vehicle 440 is a vehicle of which power source is electrical energy. The electric vehicle 440 includes the storage battery 430, and is operated by electrical energy stored in the storage battery 430. In addition, while a user is out using the electric vehicle 440, the control system 1000 cannot utilize electric power stored in the storage battery 430 mounted on the electric vehicle 440. Therefore, in the present embodiment, an example is given using the storage battery 420 that is clearly usable, rather than the storage battery 430 which may or may not be usable.

The electric equipment 500 is equipment arranged in a home and is operated by consuming electric energy. The electric equipment 500 is operated by the AC power supplied from the electric power distribution panel 610. The electric equipment 500 includes a configuration similar to that of the first home interface 17 and has a function of connecting to the first home network 710. The electric equipment 500 is controlled by the control device 100 and is monitored by the control device 100. The electric equipment 500 is, for example, an air conditioner, a water heater, an electric heater, a rice cooker, a lighting device, an electric carpet, and the like. The present embodiment is explained assuming that the number of the electric equipment 500 is one. However, it is a matter of course that the number of the electric equipment 500 may be two or more.

The electric equipment 510 is equipment that is arranged in a home and consumes electric energy to operate. The electric equipment 510 is operated by AC power supplied from the electric power distribution panel 610. The electric equipment 510 does not have a function of connecting to the first home network 710. Therefore, the electric equipment 510 is not controlled and not monitored by the control device 100. The electric equipment 510 is, for example, an air conditioner, a water heater, an electric heater, a rice cooker, a lighting device, an electric carpet, and the like.

The commercial electric power source 600 is an electric power source that an electric power company supplies a power consumer electric power. The electric power supplied by the commercial electric power source 600 is AC power. The commercial electric power source 600 supplies AC power to the electric power distribution panel 610. The commercial electric power source 600 supplies electric power at different unit costs for each time slot. In addition, it is assumed that the power consumer can buy electric power supplied from the electric power company or can sell electric power to the electric power company.

The electric power distribution panel 610 is a case storing a wiring board and a breaker to distribute AC power supplied from the electric power conditioner 310, the electric power conditioner 320, the electric power conditioner 330, the commercial electric power source 600 and the like to the electric power conditioner 320, the electric power conditioner 330, the electric equipment 500, the electric equipment 510, the commercial electric power source 600 and the like. A sum of values of AC power supplied from external devices to the electric power distribution panel 610 is equal to a sum of values of AC power supplied from the electric power distribution panel 610 to the external device.

The first home network 710 is a network such as a wireless LAN built at home, and is a network in which the control device 100, the electric power measurement device 200 and the electric equipment 500 mutually communicate. The first home network 710, for example, is a subnetwork such as the ECHONET Lite.

The second home network 720 is a network such as a wireless LAN built at home, and is a network in which the control device 100, the electric power conditioner 310, the electric power conditioner 320, the electric power conditioner 330 and the broadband router 800 mutually communicate. The first home network 710 and the second home network 720 are mutually connected via the control device 100. Therefore, the control device 100 also has a function as a gateway device.

The out-of-home network 730 is a network built out-of-home. The out-of-home network 730 is a network for mutually communicating, for example, the broadband muter 800 and the cloud server 900. The out-of-home network 730 is, for example, a Wide Area Network (WAN) such as the Internet.

The broadband router 800 is a relay device connecting the second home network 720 and the out-of-home network 730. The broadband router 800 relays communications between equipment connected to the second home network 720 and equipment connected to the out-of-home network 730.

The cloud server 900 is a server providing a resource in the cloud computing. The cloud server 900 comprises a controller controlling an entire operation of the cloud server 900, an interface for connecting to the out-of-home network 730, and a storage for storing various pieces of information. The cloud server 900 responds to a request from the control device 100, and supplies the information stored in the storage to the control device 100. In addition, the cloud server 900 responds to a request from the control device 100, executes the requested processing, and transmits the information indicating the processing result to the control device 100.

Figure 5:
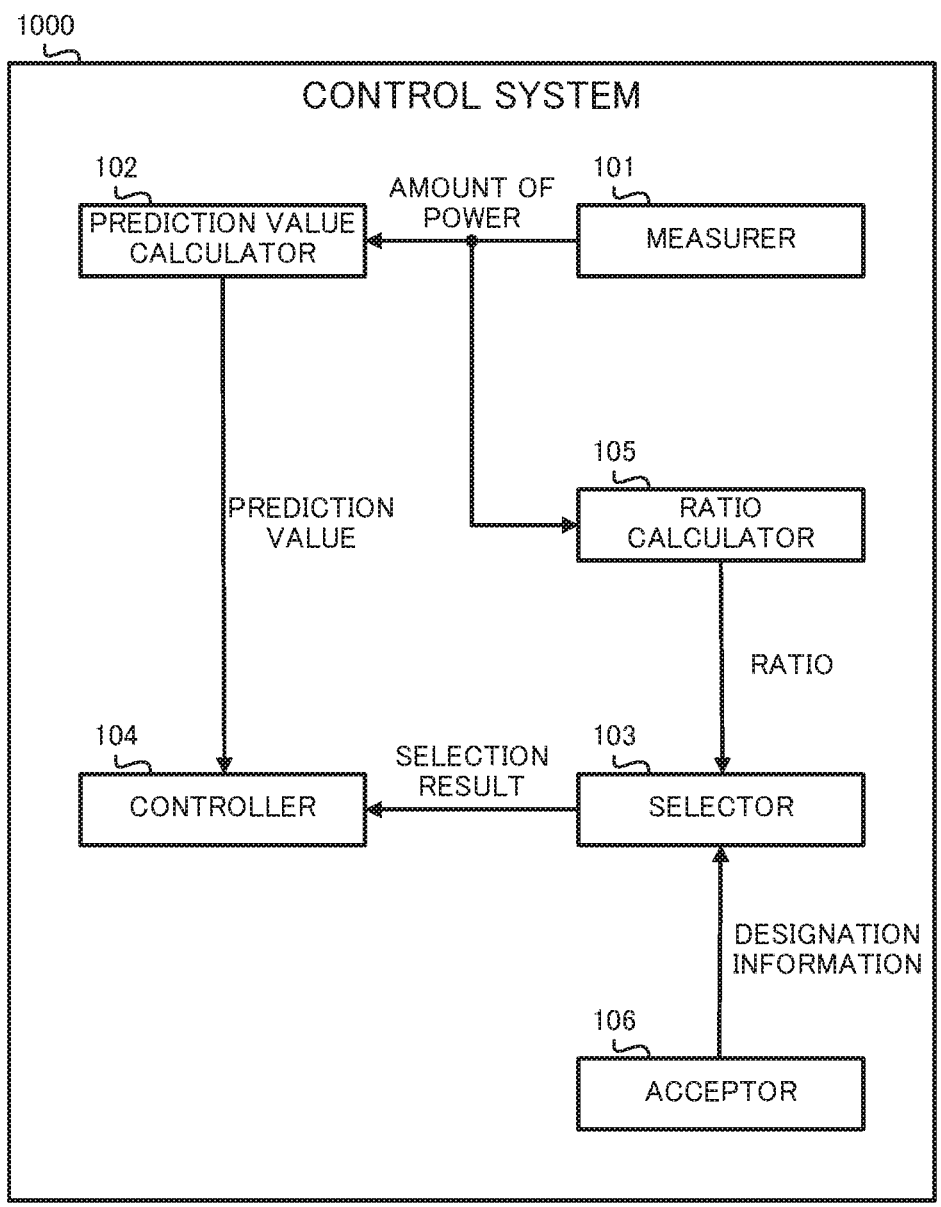
FIG. 5 is a configuration diagram explaining functions of the control system according to Embodiment 1 of the present disclosure.

Next, with reference to FIG. 5, a basic function of the control system 1000 is explained. The control system 1000 functionally comprises a measurer 101, the prediction value calculator 102, a selector 103, a controller 104, a ratio calculator 105, and an acceptor 106.

The measurer 101 measures an amount of electric power supplied from the commercial electric power source 600 to the electric equipment 500. The amount of electric power supplied from the commercial electric power source 600 to the electric equipment 500 is a concept including the amount of electric power supplied from the commercial electric power source 600 directly to the electric equipment 500, and an amount of electric power supplied from the commercial electric power source 600 to the electric equipment 500 via the storage battery 420. Therefore, the amount of electric power supplied from the commercial electric power source 600 to the electric equipment 500 is purchased amount of electric power if the charge-discharge control for the storage battery 420 is not executed. The measurer 101 measures an amount of electric power (purchased amount of electric power) supplied from the commercial electric power source 600 to the electric equipment 500 every minute, for example, from a start time of the calculation period to the current time. The function of the measurer 101 is achieved, for example, by cooperation of the CPU 21, the current detection sensor 26, and the voltage detection sensor 27.

The prediction value calculator 102 calculates the prediction value of the electricity fee based on the amount of electric power measured by the measurer 101 within the electricity fee calculation period. For example, the prediction value calculator 102 classifies the amount of electric power measured by the measurer 101 into an amount of electric power measured in a first time slot (for example, at night) and an amount of electric power measured in a second time slot (for example, in the daytime). The prediction value calculator 102 calculates purchased amount of electric power at night and purchased amount of electric power in the daytime on a daily basis.

Figure 6:
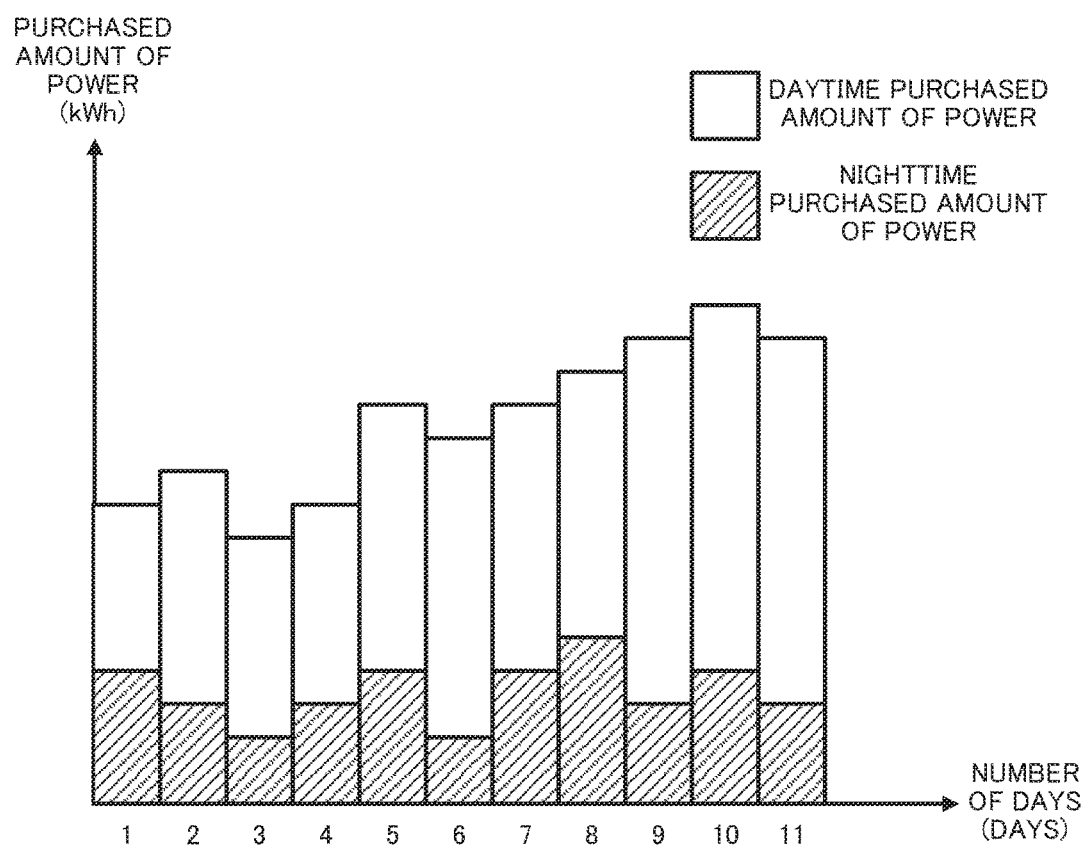
FIG. 6 is a graph illustrating amounts of daily purchased electric power.

FIG. 6 illustrates a state in which the amount of electric power purchased at night and the amount of electric power purchased in the daytime are calculated on a daily basis. In FIG. 6, hatched portions of the bar graph indicate the amount of electric power purchased at night, and white portions of the bar graph indicate the amount of electric power purchased in the daytime. FIG. 6 illustrates an example in which a month is an electricity fee calculation period (hereinafter, referred to as "the current month"). In the example in FIG. 6, after the 11th day of the current month, amounts of electric power purchased on each day from the first day of the current month to the 11th day of the current month are divided into amounts of electric power purchased during the daytime and amounts of electric power purchased during the nighttime and calculated accordingly.

Figure 7:
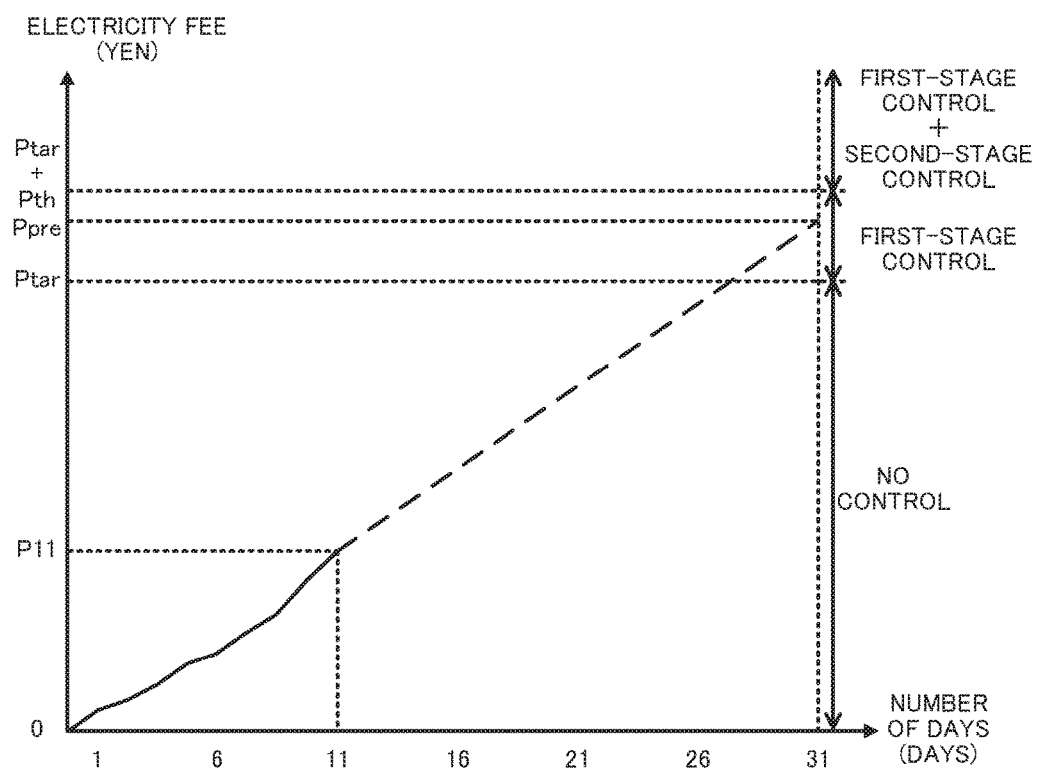
FIG. 7 is a graph illustrating increases of electricity fees on a daily basis.

Then, the prediction value calculator 102 calculates daily electricity fees. Specifically, the prediction value calculator 102 calculates, as an electricity fee of the day, a sum of values of the amount of electric power purchased at night multiplied by a nighttime unit cost, and a sum of values of the amount of electric power purchased in the daytime multiplied by a daytime unit cost. Then, the prediction value calculator 102 calculates an accumulated electricity fee for each day. FIG. 7 illustrates a state in which accumulated electricity fees increase day by day. In FIG. 7, P11 is an electricity fee at the point in time when 11th day of the current month has passed. In the present embodiment, for easier understanding, it is assumed that the electricity fee means a pay-as-you-go electricity fee and the electricity fee is a concept that does not include a base fee.

Here, the prediction value calculator 102 calculates the prediction value of the electricity fee based on the electricity fees of each day or accumulation of daily electricity fees. A method for calculating the prediction value of the electricity fee can be appropriately adjusted. For example, the prediction value calculator 102 calculates an average value of the electricity fees per day by dividing an accumulated electricity fee for each day by the number of passed days from the first day of the current month, and calculates the prediction value of the electricity fee by multiplying the average value with the number of days in the current month. Alternatively, the prediction value calculator 102 may calculate the prediction value of the electricity fee by considering rates of increase or rates of decrease of the daily electricity fee. Furthermore, the prediction value calculator 102 may calculate the prediction value of the electricity fee by considering past fluctuation records of the daily electricity fee (for example, fluctuation records of the daily electricity fee of the previous month, the fluctuation records of the daily electricity fee in the same month in the previous year). In FIG. 7, Ppre is a prediction value of the electricity fee. A function of the prediction value calculator 102 is achieved, for example, by the CPU 11 executing the program stored in the ROM 12.

The selector 103 selects either one of the charge-discharge control for the storage battery 420 and the electric power saving control for the electric equipment 500 as the first-stage control. The charge-discharge control for the storage battery 420 is a control in which electric power supplied from the commercial electric power source 600 is stored in the storage battery 420 in the first time slot, and electric power stored in the storage battery 420 is supplied to the electric equipment 500 in the second time slot in which the unit cost of the electric power supplied from the commercial electric power source 600 is relatively greater than that in the first time slot. The function of the selector 103 is achieved, for example, by the CPU 11 executing a program stored in the ROM 12.

When a prediction value calculated by the prediction value calculator 102 is greater than the target electricity fee value, the controller 104 executes the first-stage control selected by the selector 103. In other words the controller 104 plans the reduction of the electricity fee by executing the first-stage control when the controller 104 predicts that the electricity fee will exceed the target value under the current control. In FIG. 7, Ptar is the target electricity fee value. FIG. 7 illustrates that, the first-stage control is executed because Ppre, which is the prediction value of the electricity fee, is greater than Ptar, which is the target electricity fee value. The function of the controller 104 is achieved, for example, by cooperation of the CPU 11 and the first home interface 17 or by cooperation of the CPU 11 and the second home interface 18.

The selector 103 can further select the other control among the charge-discharge control and the electric power saving control as the second-stage control. In this case the controller 104 executes the first-stage control when the prediction value is greater than the target value, and the difference between the prediction value and the target value is less than the first threshold. When a prediction value is greater than the target value, and this difference is greater than the first threshold, the controller 104 further executes the second-stage control selected by the selector 103 in addition to the first-stage control. In other words the controller 104 plans the substantial reduction of the electricity fee by executing not only the first-stage control but also the second-stage control when the controller 104 predicts that the electricity fee will exceed the target value by significant amounts under the current control.

In FIG. 7, Pth indicates the first threshold. FIG. 7 illustrates that since Ppre, which is the prediction value of the electricity fee, is greater than Ptar, which is the target electricity fee value and Ppre is less than Ptar+Pth, only the first-stage control is executed. When Ppre is greater than Ptar. and even greater than Ptar+Pth, the second-stage control is executed in addition to the first-stage control. The first threshold may directly be designated as an amount of money (Japanese yen) or may indirectly be calculated as a ratio to the target electricity fee value (for example, several percent to several tens of percent).

The ratio calculator 105 calculates a ratio of the amount of electric power supplied from the commercial electric power source 600 in the second time slot in the amount of electric power supplied to the storage battery 420 from the commercial electric power source 600. For example, the ratio calculator 105 calculates a ratio of an amount of electric power purchased in the daytime to the sum of a total of the purchased amount of electric power at night and in the daytime. The ratio calculator 105 calculates this ratio based on, for example, a purchased amount of electric power during a period from the first day to the mostly-recently elapsed day of the current month, or based on a purchased amount of electric power during the most recent several days. The function of the ratio calculator 105 is achieved, for example, by the CPU 11 executing the program stored in the ROM 12.

When a ratio calculated by the ratio calculator 105 is greater than the second threshold, the selector 103 selects the charge-discharge control as the first-stage control. On the other hand, the selector 103 selects the electric power saving control as the first-stage control when this ratio is less than the second threshold. Here, if the ratio of daytime amount of consumed electric power is high, it is estimated that the reduction effect of the electricity fee by the charge-discharge control will increase. In this case the selector 103 selects the charge-discharge control as the first-stage control. The second threshold is preferably set low, for example, in a case in which the charge-discharge control is prioritized over the electric power saving control.

The acceptor 106 accepts designation information designating either one control of the charge-discharge control and the electric power saving control. In this case the selector 103 selects a control designated by the designation information accepted by the acceptor 106 as the first-stage control. For example, the acceptor 106 accepts designation information designating the charge-discharge control from a user who prefers that comfort not be reduced due to the electric power saving control. Or the acceptor 106 accepts designation information designating the electric power saving control from the user who does not mind if comfort is reduced due to the electric power saving control. The function of the acceptor 106 is achieved, for example, by cooperation of the CPU 11 and the touch screen 16.

Figure 8:
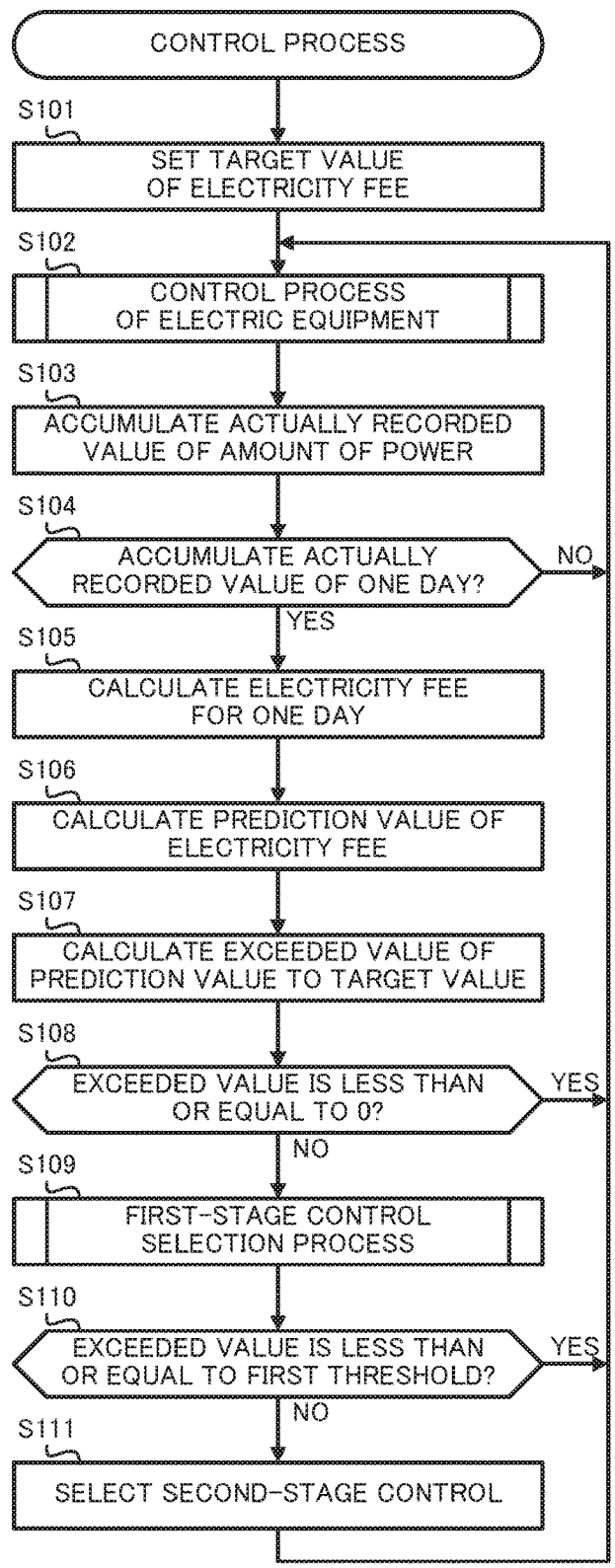
FIG. 8 is a flowchart illustrating a control process executed by the control device according to Embodiment 1 of the present disclosure.

Next, with reference to the flowchart illustrated in FIG. 8, the control processing executed by the control device 100 is explained. The control processing starts, for example, in response to the electric power source of the control device 100 being turned on.

First the CPU 11 sets the target electricity fee value (step S101). For example, the CPU 11 sets the target electricity fee value based on a user operation for the touch screen 16. When there is no user operation for the touch screen 16, the CPU 11 sets, for example, an initial value stored in the flash memory 14 or the like to the target electricity fee value. This initial value, for example, is set according to an actually recorded value of the electricity fee of the same month in the previous year, an average value of the electricity fee of a general family and the like.

Figure 9:
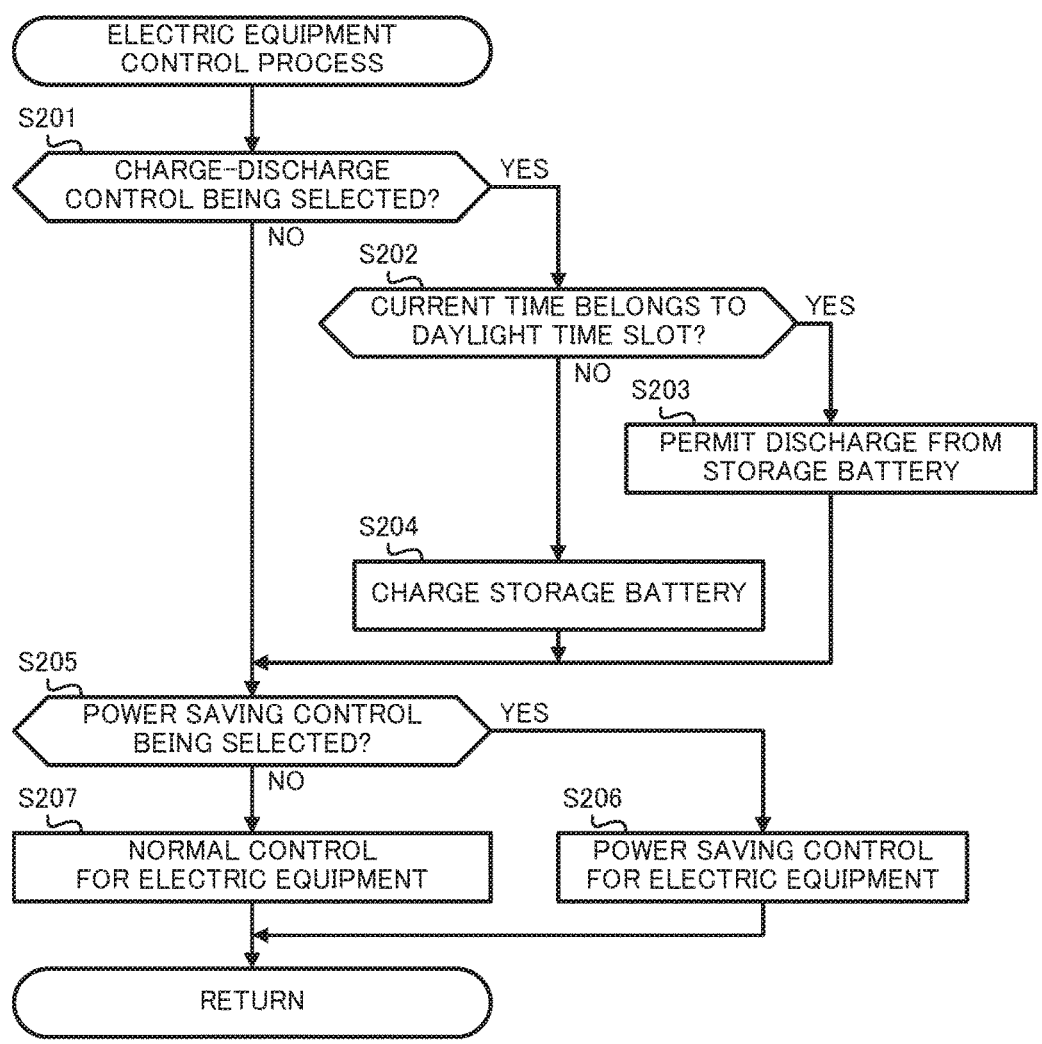
FIG. 9 is a flowchart illustrating an electric equipment control process illustrated in FIG. 8.

When the CPU 11 completes processing of step S101, the CPU 11 executes electric equipment control processing (step S102). The electric equipment control processing is explained in detail with reference to the flowchart illustrated in FIG. 9. Here, the electric equipment control processing basically is the processing in which the control device 100 controls the electric equipment 500.

First the CPU 11 determines whether the charge-discharge control is selected (step S201). Specifically, the CPU 11 determines whether the charge-discharge control is selected as the first-stage control or the second-stage control.

When the CPU 11 determines that the charge-discharge control is selected (step S201: YES), the CPU 11 determines whether the current time belongs in daytime time slot (step S202). When the CPU 11 determines that the current time belongs to a daytime time slot (step S202: YES), the CPU 11 allows the storage battery 420 to discharge (step S203). While the discharge of the storage battery 420 is allowed, the electric power stored in the storage battery 420 is used for controlling the electric equipment 500 in the electric power saving control in step S206 or a normal control in step S207.

On the other hand, when the CPU 11 determines that the current time does not belong to the daytime time slot (S202: NO), the CPU 11 charges the storage battery 420 (step S204). Specifically, the CPU 11 controls the electric power conditioner 320 and causes the electric power supplied from the commercial electric power source 600 to be stored in the storage battery 420. While the storage battery 420 is being charged, the storage battery 420 is prohibited from discharging. While the storage battery 420 is prohibited from discharging, the electric power (purchased electric power) supplied from the commercial electric power source 600 is used for controlling the electric equipment 500 in the electric power saving control in step S206 or a normal control in step S207.

When the CPU 11 determines that the charge-discharge control is not selected (step S201: NO) and when the CPU 11 completes processing of step S203 or step S204, the CPU 11 determines whether the electric power saving control is selected (step S205). Specifically, the CPU 11 determines whether the electric power saving control is selected as the first-stage control or the second-stage control.

When the CPU 11 determines that the electric power saving control is selected (step S205: YES), the CPU 11 controls the electric equipment 500 using the electric power saving control (step S206). For example, the CPU 11 controls the electric equipment 500 using a control command instructing a control in which a reduced amount of electric power is consumed, and/or transmits a control command instructing the setting of the electric power saving mode to the electric equipment 500.

On the other hand, when the CPU 11 determines that the electric power saving control is not selected (step S205: NO), the CPU 11 performs normal control of the electric equipment 500 (step S207). For example, the CPU 11 controls the electric equipment 500 using a control command instructing a control of consuming increased amount of electric power and/or transmits to the electric equipment 500 a control command instructing a setting of the normal mode. The CPU 11 completes the electric equipment control processing when the CPU 11 completes processing of step S206 or step S207.

The CPU 11 accumulates actually recorded values of the amount of electric power when the CPU 11 completes the electric equipment control processing of step S102 (step S103). For example, the CPU 11 acquires electric power information from the electric power measurement device 200, and stores the acquired electric power information in the flash memory 14. This electric power information is assumed to indicate at least actually recorded values of purchased amount of electric power for every minute.

When the CPU 11 completes processing of step S103, the CPU 11 determines whether actually recorded values for one day are accumulated (step S104). For example, the CPU 11 determines whether actually recorded values of purchased amount of electric power for one minute have been stored 60×24 times. For example, with reference to information supplied from an RTC 14, the CPU 11 determines whether the current time has passed over 0:00 midnight. When the CPU 11 determines that actually recorded values for one day are not accumulated (step S104: NO), the CPU 11 returns the processing to step S102.

On the other hand, when the CPU 11 determines that the actually recorded values for one day are accumulated (step S104: YES), the CPU 11 calculates the electricity fee for the day (step S105). Specifically, the CPU 11 calculates a nighttime consumed amount of electric power and a daytime consumed amount of electric power based on the electric power information stored in the flash memory 14. Then, the CPU 11 calculates, as an electricity fee of the day, a sum of values of the amount of electric power consumed at night multiplied by a nighttime unit cost, and of the amount of electric power consumed in the daytime multiplied by a daytime unit cost.

The CPU 11 calculates the prediction value of the electricity fee when the CPU 11 completes processing of step S105 (step S106). For example, the CPU 11 calculates the prediction value of the electricity fee of the current month, by calculates the average value of the electricity fee for the days of the current month, and multiplies the number of days of the current month by the calculated average value.

The CPU 11 calculates an excess value of the prediction value of the electricity fee in relation to the target electricity fee value when the CPU 11 completes processing of step S106 (step S107). This excess value is a value acquired by subtracting the target electricity fee value from the prediction value of the electricity fee.

When the CPU 11 completes processing of step S107, the CPU 11 determines whether the excess value is equal to or less than 0 (step S108). When the CPU 11 determines that the excess value is 0 or less (step S108: YES), the CPU 11 returns the processing to step S102.

Figure 10:
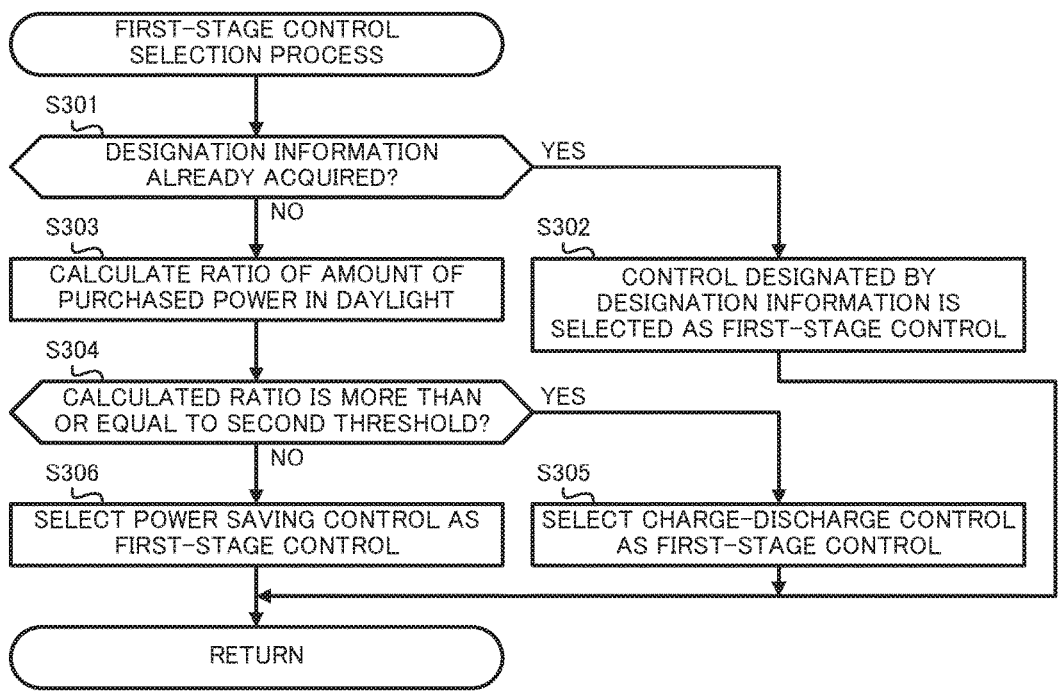
FIG. 10 is a flowchart illustrating the first-stage control selection process illustrated in FIG. 8.

On the other hand, when the CPU 11 determines that the excess value is not equal to or less than 0 (step S108: NO), the CPU 11 executes the first-stage control selection processing (step S109). The first-stage control selection processing is explained in detail with reference to the flowchart illustrated in FIG. 10.

First the CPU 11 determines whether the designation information is acquired (step S301). For example, the CPU 11 determines whether the designation information accepted from a user via the touch screen 16 is stored in the flash memory 14. When the CPU 11 determines that the designation information is acquired (step S301: YES), the CPU 11 selects the control designated by the designation information as the first-stage control (step S302).

On the other hand, when the CPU 11 determines the designation information is not acquired (step S301: NO), the CPU 11 calculates the ratio of the amount of electric power purchased in the daytime (step S303). For example, the CPU 11 calculates the ratio of the amount of electric power purchased in the daytime during most recent several days to the purchased amount of electric power in the day time and at night during the most recent several days.

The CPU 11 determines whether the calculated ratio is equal to or greater than the second threshold, when the CPU 11 completes processing of step S303 (step S304). When the CPU 11 determines that the calculated ratio is the second threshold or more (step S304: YES), the CPU 11 selects the charge-discharge control as the first-stage control (step S305). On the other hand, when the CPU 11 determines that the calculated ratio is not the second threshold or more (step S304: NO), the CPU 11 selects the electric power saving control as the first-stage control (step S306). When the CPU 11 completes processing of step S302, step S305, or step S306, the CPU 11 completes the first-stage control selection processing.

When the CPU 11 completes the first-stage control selection processing of step S109, the CPU 11 determines whether the excess amount is the first threshold or less (step S110). When the CPU 11 determines that the excess amount is the first threshold or less (step S110: YES), the CPU 11 returns the processing to step S102.

On the other hand, when the CPU 11 determines that the excess amount is not the first threshold or less (step S110: NO), the CPU 11 selects the second-stage control (step S111). The second-stage control is a control that is not selected as the first-stage control among the charge-discharge control and the electric power saving control. When the CPU 11 completes processing of step S111, the CPU 11 returns the processing to step S102.

As explained above, in the present embodiment, the first-stage control selected among the charge-discharge control and the electric power saving control is executed when the prediction value of the electricity fee is greater than the target electricity fee value. In this way, in the present embodiment, an appropriate control that reduces the electricity fee is executed in the appropriate timing. Therefore, according to the present embodiment, electricity fees are reduced to a great extent.

In the present embodiment, when the prediction value of the electricity fee is greater than the target electricity fee value, and a difference between the target value and the prediction value is greater than the first threshold, the second-stage control is further executed in addition to the first-stage control. Therefore, according to the present embodiment, electricity fees are largely reduced.

In addition, in the present embodiment, the charge-discharge control is selected as the first-stage control and executed when the ratio of the amount of electric power supplied from the commercial electric power source 600 to the electric equipment 500 in the second time slot among the amount of electric power supplied from the commercial electric power source 600 to the electric equipment 500 is greater than the second threshold. Therefore, according to the present embodiment, electricity fees are reduced by the effective control.

In addition, in the present embodiment, the control designated by the designation information is selected as the first-stage control and is executed. Therefore, according to the present embodiment, electricity fees are reduced by the execution of the designated control.

Embodiment 2

In Embodiment 1, an example is explained in which the first-stage control is selected depending on the ratio of the amount of electric power purchased in the daytime. In the present disclosure, the technique to select the first-stage control is not limited to this example. A control system 1100 according to Embodiment 2 is explained as follows. The physical configuration of the control system 1100 is similar to the physical configuration of the control system 1000. In the control system 1100, in place of the charge-discharge control for the storage battery 420, the charge-discharge control for the storage battery 430 mounted on the electric vehicle 440 is executed. In addition, in the control system 1100, the first threshold is set to a large enough value, and the second-stage control is not executed. In other words, in the control system 1100, only one of the charge-discharge control and the electric power saving control is executed.

Figure 11:
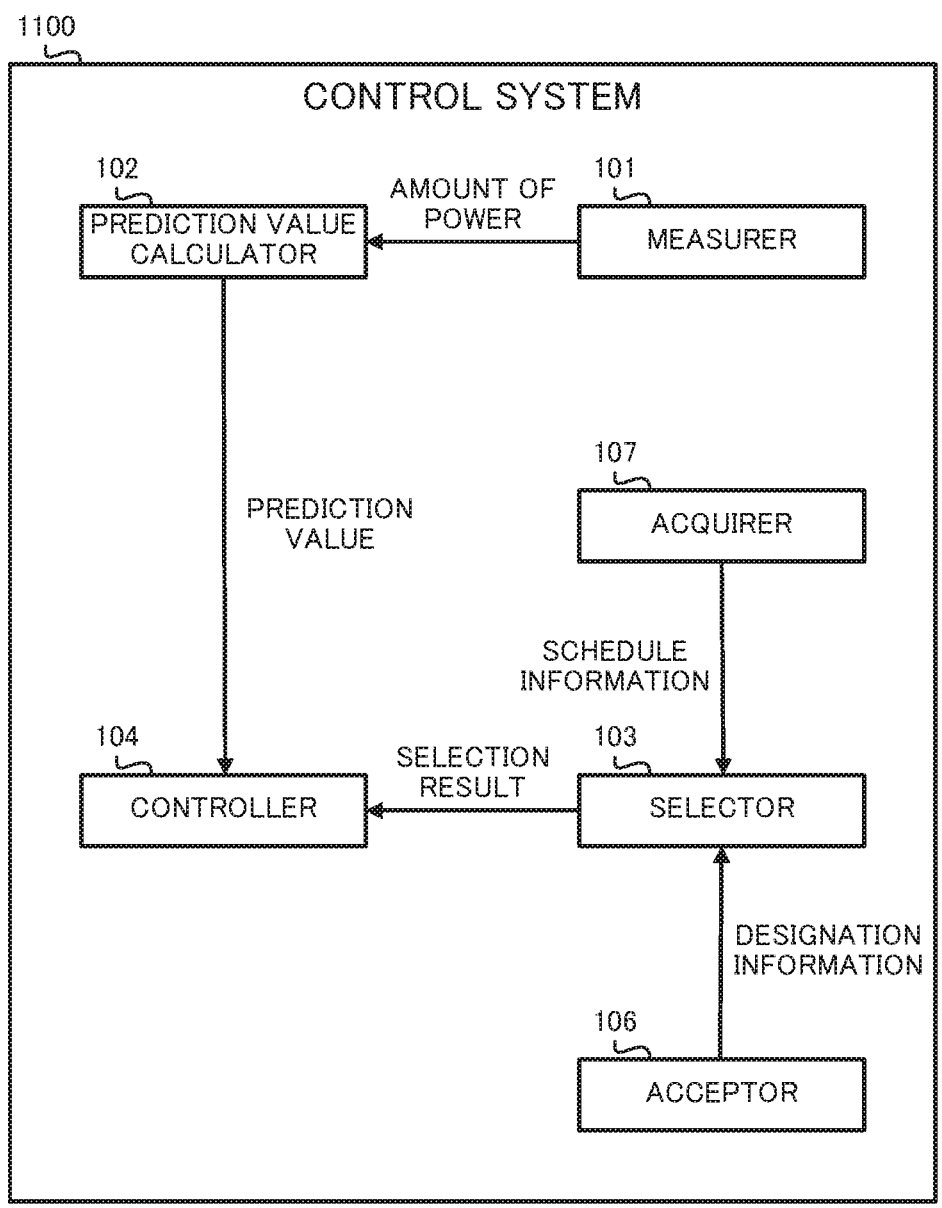
FIG. 11 is a configuration diagram explaining functions of the control system according to Embodiment 2 of the present disclosure.

With reference to FIG. 11, basic functions of the control system 1100 are explained. The control system 1100 functionally comprises the measurer 101, the prediction value calculator 102, the selector 103, the controller 104, the acceptor 106, and an acquirer 107. The functions of the measurer 101, the prediction value calculator 102, the controller 104, and the acceptor 106 are basically as explained in Embodiment 1. The selector 103 and the acquirer 107 are explained as follows.

The acquirer 107 acquires schedule information indicating the schedule of the electric vehicle 440. Here, the storage battery 430 is mounted on the electric vehicle 440 and moves with the electric vehicle 440. For this reason, the date and time at which the storage battery 430 is available can be estimated using the schedule information. The schedule information is acquired, for example, by a user operation for the touch screen 16. Alternatively, the schedule information may be acquired from the cloud server 900. The schedule information is stored, for example, in the flash memory 14. The function of the acquirer 107 is achieved, for example, by cooperation of the CPU 11 and the touch screen 16 or by cooperation of the CPU 11 and the second home interface 18.

When the storage battery 430 is estimated to be available using the schedule information acquired by the acquirer 107, the selector 103 selects the charge-discharge control as the first-stage control. On the other hand, the selector 103 selects the electric power saving control as the first-stage control when the storage battery 430 is estimated to be unavailable using the schedule information. In this way, the selector 103 selects, as the first-stage control, an appropriate control as a control that reduces electricity fees.

Figure 12:
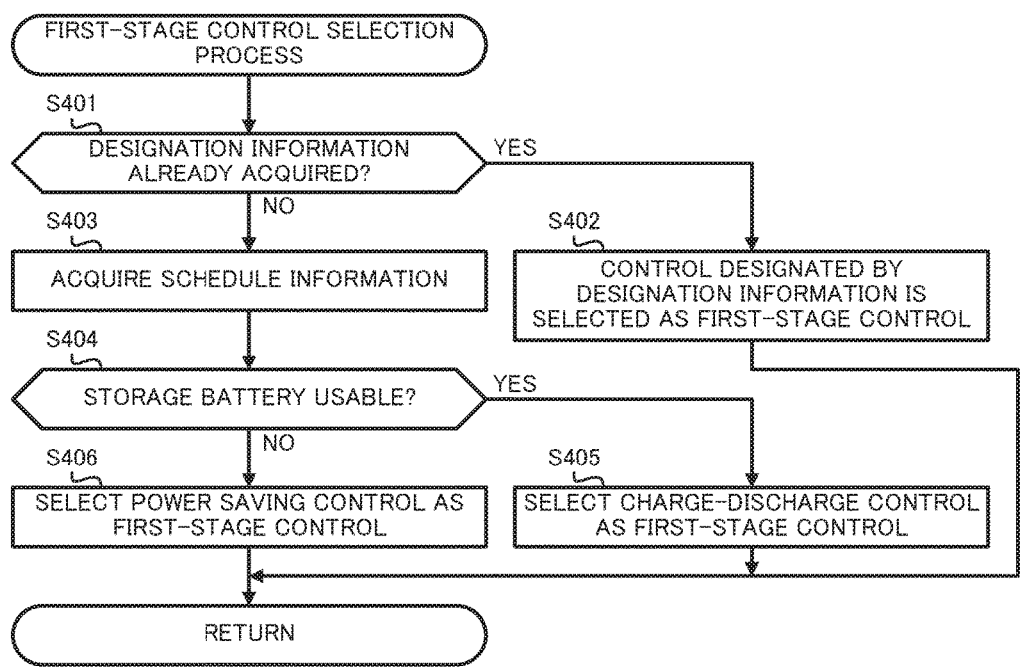
FIG. 12 is a flowchart illustrating a first-stage control selection process executed by the control device according to Embodiment 2 of the present disclosure.

Next, the first-stage control selection processing executed by the control device 100 included in the control system 1100 is explained in detail with reference to the flowchart illustrated in FIG. 12.

First the CPU 11 determines whether the designation information is acquired (step S401). When the CPU 11 determines that the designation information is acquired (step S401: YES), the CPU 11 selects the control designated by the designation information as the first-stage control (step S402).

On the other hand, when the CPU 11 determines that the designation information is not acquired (step S401: NO), the CPU 11 acquires the schedule information (step S403). For example, the CPU 11 acquires the schedule information stored in the flash memory 14.

The CPU 11 determines whether the storage battery 430 is available on the current day based on the acquired schedule information when the CPU 11 completes processing of step S403 (step S404). When the CPU 11 determines that the storage battery 430 is available (step S404: YES), the CPU 11 selects the charge-discharge control as the first-stage control (step S405). On the other hand, when the CPU 11 determines that the storage battery 430 is not available (step S404: NO), the CPU 11 selects the electric power saving control as the first-stage control (step S406). When the CPU 11 completes step S402, step S405, or step S406, the CPU 11 completes the first-stage control selection processing.

As explained above, in the present embodiment, when the storage battery 430 is estimated to be available from the schedule information, the charge-discharge control is selected as the first-stage control, and when the storage battery 430 is estimated to be not available from the schedule information, the electric power saving control is selected as the first-stage control. Therefore, according to the present embodiment, electricity fees are reduced by an execution of the appropriate control.

In the present embodiment, neither the charge-discharge control nor the electric power saving control is executed while the prediction value of the electricity fee does not exceed the target electricity fee value. Therefore, disadvantages associated with charge-discharge control are less likely to be experienced. Disadvantages due to the charge-discharge control are, for example, an increase in electricity fee due to power loss during the charge/discharge, an increase in electricity fee due to the storage battery 430 not being available unexpectedly, a shortened life of the storage battery 430, complex control of the electric equipment 500 and the like. In addition, disadvantages associated with electric power saving control are less likely to be experienced. A disadvantage due to the electric power saving control is, for example, that the optimal operation of the electric equipment 500 is limited with less convenience.

Modified Example

However Embodiments of the present disclosure are explained as above, various modifications and applications are possible in executing the present disclosure.

Any portion of the configurations, functions, and/or operations explained in Embodiment 1 and Embodiment 2 may be adopted in the present disclosure. Furthermore, in the present disclosure, further configurations, functions, and/or operations may be adopted other than the aforementioned configurations, functions, and/or operations. In addition, the configurations, functions, and/or operations explained in Embodiment 1 and Embodiment 2 may be freely combined.

For example, in Embodiment 1, an example is explained in which the charge-discharge control for the storage battery 420 is executed. In Embodiment 2, an example is explained in which the charge-discharge control for the storage battery 430 is executed. In the present disclosure, both of the charge-discharge control of the storage battery 420 and the charge-discharge control for the storage battery 430 may be executed. In this case, for example, when the difference between the prediction value of the electricity fee and the target electricity fee value is less than the third threshold, the charge-discharge control for either one of the storage battery 420 and the storage battery 430 is preferably executed, and when the difference is greater than the third threshold, the charge-discharge controls for both of the storage battery 420 and the storage battery 430 are preferably executed.

Alternatively, when the storage battery 430 is available, the storage battery 430 may be used, and the storage battery 420 may be used when the storage battery 430 is not available. Cases when the storage battery 430 is not available are, for example, a case when the electric vehicle 440 carrying the storage battery 430 is not connected to the electric power conditioner 330, and a case when it is not desirable to cause the storage battery 430 to discharge for securing a charging amount of the storage battery 430.

In Embodiment 1, an example is explained in which, when the electric power saving control is executed, degrees of the electric power saving control are uniform. In the present disclosure, a degree of the electric power saving control may be determined depending on the difference between the prediction value of the electricity fee and the target electricity fee value. For example, it is preferable that, as the difference increases, the electric power saving control that can save electric power to a greater extent is executed.

In Embodiment 1, an example is explained in which whether the first-stage control and/or the second-stage control is/are execute depending on the difference between the prediction value of the electricity fee and the target electricity fee value is determined. In the present disclosure, in addition to this difference, after the remaining number of days is further considered, whether the first-stage control and/or the second-stage control is/are executed may be determined. For example, the less the remaining number of days, the easier the first-stage control and the second-stage control are preferably executed.

In Embodiment 1, an example is explained in which electric power stored in the storage battery 420 is supplied from the commercial electric power source 600. The electric power stored in the storage battery 420 may be supplied from the electric power generation panel 410. Here, the charge-discharge control using purchased electric power is executed only when the charge-discharge control is selected as the first-stage control or the second-stage control, and the charge-discharge control using the generated electric power may be executed on a steady basis. In addition, the generated electric power may be sold to substantially reduce electricity fees.

In Embodiment 1, an example is explained in which the control device 100 includes the user interface (the touch screen 16). In the present disclosure, the control device 100 may not include the user interface. For example, in the control system 1000 of the present disclosure, a terminal device (for example, a tablet terminal, a smartphone) connected to the control device 100 via the first home network 710, the second home network 720, and the out-of-home network 730 may include a user interface.

In Embodiment 1, an example is explained in which the usage condition of the storage battery 420 is not presented to the user. In the present disclosure, the usage condition of the storage battery 420 may be presented to the user. In this case, for example, the CPU 11 can display the usage condition of the storage battery 420 on the touch screen 16. The usage conditions of the storage battery 420, for example, are a charge amount of one day, a discharge amount of one day, and a rate of utilization. In this way, for example, the user can grasp whether the charge-discharge control using the storage battery 420 is effectively executed.

In Embodiment 1, an example is explained in which the control device 100, the electric power measurement device 200, and the electric equipment 500 are mutually connected via the first home network 710, the control device 100, the electric power conditioner 310, the electric power conditioner 320, the electric power conditioner 330, and the broadband router 800 are connected together via the second home network 720, and the broadband router 800 and the cloud server 900 are connected together via the out-of-home network 730. In the present disclosure, it is a matter of course that paths through which each component is connected are not limited to this example.

In addition, in Embodiment 1, an example is explained in which the calculation period of the amount of electric power is one minute, the period of selecting the control such as the first-stage control and the second-stage control is one day, and the calculation period of the electricity fee is one month. It is a matter of course that the calculation period of the amount of electric power, the period of selecting the control, and the calculation period of the electricity fee are not limited to this example.

In addition, in Embodiment 1, an example is explained in which the control system 1000 includes the selector 103 that selects the first-stage control and the second-stage control. In the present disclosure, the control system 1000 may not include the selector 103. In this case, for example, either one of the charge-discharge control and the electric power saving control is preset as the first-stage control, and the other control is preset as the second-stage control. An appropriate control is executed depending on the difference between the prediction value of the electricity fee and the target electricity fee value in a stepwise fashion in such a configuration.

The present disclosure can be embodied in various ways and can undergo various modifications without departing from the broad spirit and scope of the disclosure. Moreover, the embodiment described above is for explaining the present disclosure, and does not limit the scope of the present disclosure. In other words, the scope of the present disclosure is as set forth in the Claims and not the embodiment. Various changes and modifications that are within the scope disclosed in the claims or that are within a scope that is equivalent to the claims of the disclosure are also included within the scope of the present disclosure.

INDUSTRIAL APPLICABILITY

The present disclosure is applicable to a control system executing the charge-discharge control or the electric power saving control.

REFERENCE SIGNS LIST 11, 21, 31 CPU
12, 22, 32 ROM
13, 23, 33 RAM
14, 24, 34 Flash memory
15, 25, 35 RTC
16 Touch screen
17, 28 First home interface
18, 37 Second home interface
26 Current detection sensor
27 Voltage detection sensor
36 DC/AC converter
100 Control device
101 Measurer
102 Prediction value calculator
103 Selector
104 Controller
105 Ratio calculator
106 Acceptor
107 Acquirer
200 Electric power measurement device
310, 320, 330 Electric power conditioner
410 Electric power generation panel
420, 430 Storage battery
440 Electric vehicle
500, 510 Electric equipment
600 Commercial electric power source
610 Electric power distribution panel
710 First home network
720 Second home network
730 Out-of-home network
800 Broadband router
900 Cloud server
1000, 1100 Control system

The invention claimed is:

1. A control device comprising:
a selector configured to select, as a first-stage control, either one control of an electric power saving control for electric equipment and a charge-discharge control in which electric power supplied from a commercial electric power source is stored in a storage battery in a first time slot and the electric power stored in the storage battery is supplied to the electric equipment in a second time slot in which a unit cost of the electric power supplied from the commercial electric power source is greater than that in the first time slot; and
a controller configured to, in a case in which a prediction value of an electricity fee is greater than a target value of an electricity fee, (i) execute the charge-discharge control when the charge-discharge control is selected as the first-stage control by the selector, and (ii) execute the electric power saving control when the electric power saving control is selected as the first-stage control by the selector.

2. The control device according to claim 1, further comprising an acceptor configured to receive designation information designating either one control of the charge-discharge control and the electric power saving control,
wherein the selector is configured to select the charge-discharge control as the first-stage control when the charge-discharge control is designated by the designation information received by the acceptor, and to select the electric power saving control as the first-stage control when the electric power saving control is designated by the designation information.

3. A control device comprising:
a selector configured to select, as a first-stage control, either one control of an electric power saving control for electric equipment and a charge-discharge control in which electric power supplied from a commercial electric power source is stored in a storage battery in a first time slot and the electric power stored in the storage battery is supplied to the electric equipment in a second time slot in which a unit cost of the electric power supplied from the commercial electric power source is greater than that in the first time slot; and
a controller configured to execute the first-stage control selected by the selector, when a prediction value of an electricity fee is greater than a target value of an electricity fee,
wherein
the selector is further configured to select, as a second-stage control, an other control of the electric power saving control and the charge-discharge control, and the controller is further configured to execute the first-stage control when the prediction value is greater than the target value and a difference between the prediction value and the target value is less than a first threshold, and to execute the second-stage control selected by the selector in addition to the first-stage control when the prediction value is greater than the target value and the difference is greater than the first threshold.

4. A control device comprising:
a selector configured to select, as a first-stage control, either one control of an electric power saving control for electric equipment and a charge-discharge control in which electric power supplied from a commercial electric power source is stored in a storage battery in a first time slot and the electric power stored in the storage battery is supplied to the electric equipment in a second time slot in which a unit cost of the electric power supplied from the commercial electric power source is greater than that in the first time slot;
a controller configured to execute the first-stage control selected by the selector, when a prediction value of an electricity fee is greater than a target value of an electricity fee; and
a ratio calculator configured to calculate a ratio of an amount of electric power supplied from the commercial electric power source to the electric equipment in the second time slot among the amount of electric power supplied from the commercial electric power source to the electric equipment,
wherein the selector is configured to select the charge-discharge control as the first-stage control when the ratio calculated by the ratio calculator is greater than a second threshold, and to select the electric power saving control as the first-stage control when the ratio is less than the second threshold.

5. A control device comprising:
a selector configured to select, as a first-stage control, either one control of an electric power saving control for electric equipment and a charge-discharge control in which electric power supplied from a commercial electric power source is stored in a storage battery mounted on an electric vehicle in a first time slot and the electric power stored in the storage battery is supplied to the electric equipment in a second time slot in which a unit cost of the electric power supplied from the commercial electric power source is greater than that in the first time slot;
a controller configured to execute the first-stage control selected by the selector, when a prediction value of an electricity fee is greater than a target value of an electricity fee; and
an acquirer configured to acquire schedule information indicating a schedule of the electric vehicle,
wherein
the selector is configured to select the charge-discharge control as the first-stage control when the storage battery is indicated to be available by the schedule information acquired by the acquirer, and to select the electric power saving control as the first-stage control when the storage battery is indicated to be not available by the schedule information acquired by the acquirer.

6. A control device comprising:
a controller configured to,
when a prediction value of an electricity fee is greater than a target value of an electricity fee and a difference between the prediction value and the target value is less than a first threshold, execute either one control of an electric power saving control for electric equipment and a charge-discharge control in which electric power supplied from a commercial electric power source is stored in a storage battery in a first time slot and the electric power stored in the storage battery is supplied to the electric equipment in a second time slot in which a unit cost of the electric power supplied from the commercial electric power source is greater than that in the first time slot, and
when the prediction value is greater than the target value and the difference is greater than the first threshold, execute the electric power saving control and the charge-discharge control.

7. A control system comprising:
a measurer configured to measure an amount of electric power supplied from a commercial electric power source to electric equipment;
a selector configured to select, as a first-stage control, either one control of an electric power saving control for the electric equipment and a charge-discharge control in which the electric power supplied from the commercial electric power source is stored in a storage battery in a first time slot and the electric power stored in the storage battery is supplied to the electric equipment in a second time slot in which a unit cost of the electric power from the commercial electric power source is greater than that in the first time slot; and
a controller configured to, in a case in which a prediction value of an electricity fee based on the amount of electric power measured by the measurer is greater than a target value of an electricity fee, (i) execute the charge-discharge control when the charge-discharge control is selected as the first-stage control by the selector, and (ii) execute the electric power saving control when the electric power saving control is selected as the first-stage control by the selector.

8. A control method comprising:
selecting, as a first-stage control, either one control of an electric power saving control for electric equipment and a charge-discharge control in which electric power supplied from a commercial electric power source is stored in a storage battery in a first time slot and the electric power stored in the storage battery is supplied to the electric equipment in a second time slot in which a unit cost of the electric power supplied from the commercial electric power source is greater than that in the first time slot; and
in a case in which a prediction value of an electricity fee is greater than a target value of an electricity fee, (i) executing the charge-discharge control when the charge-discharge control is selected as the first-stage control, and (ii) executing the electric power saving control when the electric power saving control is selected as the first-stage control.

9. A non-transitory computer-readable recording medium storing a program for causing a computer to function as:
a selector configured to select, as a first-stage control, either one control of an electric power saving control for electric equipment and a charge-discharge control in which electric power supplied from a commercial electric power source is stored in a storage battery in a first time slot and the electric power stored in the storage battery is supplied to the electric equipment in a second time slot in which a unit cost of the electric power supplied from the commercial electric power source is greater than that in the first time slot; and a controller configured to, in a case in which a prediction value of an electricity fee is greater than a target value of an electricity fee, (i) execute the charge-discharge control when the charge-discharge control is selected as the first-stage control by the selector, and (ii) execute the electric power saving control when the electric power saving control is selected as the first-stage control by the selector.

\* \* \* \* \*